United States Patent
Lin et al.

(10) Patent No.: US 7,069,398 B2
(45) Date of Patent: Jun. 27, 2006

(54) APPARATUS AND METHOD FOR DE-INTERLEAVING THE INTERLEAVED DATA IN A CODED ORTHOGONAL FREQUENCY DIVISION MULTIPLEXING RECEIVER

(75) Inventors: Chun-Yu Lin, Shindian (TW); Yung-Hua Hung, Hsinchu (TW); Chih-Chun Feng, Yun-Lin (TW)

(73) Assignee: Industrial Technology Research Institute, Hsinchu (TW)

( * ) Notice: Subject to any disclaimer, the term of this patent is extended or adjusted under 35 U.S.C. 154(b) by 539 days.

(21) Appl. No.: 10/600,485

(22) Filed: Jun. 20, 2003

(65) Prior Publication Data

US 2004/0258170 A1    Dec. 23, 2004

(51) Int. Cl.
*G06F 12/02* (2006.01)
*H04J 11/00* (2006.01)

(52) U.S. Cl. ............... 711/157; 711/220; 370/208; 370/478

(58) Field of Classification Search ........... 711/157, 711/168, 127, 211, 220; 370/478, 281, 290, 370/208
See application file for complete search history.

(56) References Cited

U.S. PATENT DOCUMENTS

| | | | | |
|---|---|---|---|---|
| 5,862,189 A | | 1/1999 | Huisken et al. | 375/341 |
| 5,940,863 A | * | 8/1999 | Fimoff et al. | 711/157 |
| 6,138,262 A | | 10/2000 | Baek | 714/768 |
| 6,151,690 A | * | 11/2000 | Peeters | 714/701 |
| 6,704,848 B1 | * | 3/2004 | Song | 711/157 |
| 6,748,033 B1 | * | 6/2004 | Shiraishi et al. | 375/340 |
| 6,910,110 B1 | * | 6/2005 | Kim et al. | 711/157 |
| 2002/0046329 A1 | | 4/2002 | Song | 711/157 |
| 2004/0258170 A1 | * | 12/2004 | Lin et al. | 375/260 |

* cited by examiner

*Primary Examiner*—Brian R. Peugh

(57) ABSTRACT

An apparatus and method having a de-interleaving memory and a controller is used for de-interleaving interleaved data in a coded orthogonal frequency division multiplexing receiver. The controller generates the correct access addresses of the de-interleaving memory for the data to be de-interleaved, and controls the read and write operations to the de-interleaving memory. The controller comprises an address generator having a plurality of base address generators, and a read/write control circuitry. By using the de-interleaving memory combined with memory address computation for the interleaved data, frequency de-interleaving, block de-interleaving and time de-interleaving are performed in one-stage approach in the COFDM receiver. The memory size is reduced and the circuitry complexity for performing the de-interleaving process is relatively low.

13 Claims, 6 Drawing Sheets

APPARATUS AND METHOD FOR DE-INTERLEAVING THE INTERLEAVED DATA IN A CODED ORTHOGONAL FREQUENCY DIVISION MULTIPLEXING RECEIVER

FIELD OF THE INVENTION

The present invention generally relates to the field of processing the interleaved data in coded orthogonal frequency division multiplexing (COFDM) communication systems, such as a digital audio broadcasting (DAB) system, and more particularly to an apparatus and method for de-interleaving the interleaved data in a COFDM receiver.

BACKGROUND OF THE INVENTION

In communication systems, data are often distorted by channel impairments (e.g., fading, multipath) during transmission. This may cause the so-called burst error, i.e. successively erroneous data. An interleaver/de-interleaver is generally used to overcome the effect of burst errors. Specifically, the interleaver interleaves successive data into non-successive data for transmission. If burst of errors occurs in the interleaved data, the de-interleaver in the receiver will de-interleave the successively erroneous data into non-successive data. Accordingly, the de-interleaved data would not have large amount of burst errors. This thus prevents the channel decoder in the receiver from overloading its error correction capability for correcting the large amount of successively erroneous data.

For COFDM systems such as a DAB system, time interleaving is used against the burst errors caused by time-varying channel fading, and frequency interleaving and block interleaving are used against the burst errors caused by multipath propagations. In DAB system, the transmitter performs time interleaving, block interleaving, and frequency interleaving in a sequential order. In the receiver, the complementary operations, frequency de-interleaving, block de-interleaving and time de-interleaving, must be performed in a reverse order, so that the de-interleaved data have the same order as the original ones.

FIG. 1a is a block diagram illustrating the interleaving process in a DAB transmitter. As can be seen from FIG. 1a, the interleaving process includes three procedures: time interleaving, block interleaving and frequency interleaving. First, a time interleaver 101, which is a convolutional interleaver, interleaves the input data bit stream according to a cyclic repeated delay pattern to generate a time interleaved bit stream 102. This time interleaved bit stream 102 is fed to a block interleaver 103. The block interleaver 103 maps every two data bits in the time interleaved bit stream 102 into one symbol in a manner that is illustrated by the followings. Two blocks of successive data bits are shown in the time interleaved bit stream 102: a block comprising bits b[0] . . . b[N−1] and another block comprising bits b[N] . . . b[2N−1], where N is the number of used sub-carriers. Each bit in the block b[0] . . . b[N−1] is paired with the corresponding bit in the block b[N] . . . b[2N−1] to form a mapped symbol (b[j], b[j+N]), j∈[0, N−1], where b[j] and b[j+N] represent the in-phase (I) component and quadrature-phase (Q) component of the mapped symbol (b[j], b[j+N]). The mapped symbols (b[0], b[N]), . . . , (b[N−1], b[2N−1]) are then interleaved to non-successive sub-carriers via a frequency interleaver 105. Finally, the OFDM modulator 107 generates modulated samples by performing differential quarternary phase shift keying (QPSK) modulation and multicarrier modulation.

FIG. 1b is a block diagram illustrating the de-interleaving process in a DAB receiver. It shows that the de-interleaving process is performed in a reverse order with respect to that in FIG. 1a. Referring to FIG. 1b, the OFDM demodulator 109 generates demodulated samples by performing multicarrier demodulation and differential QPSK demodulation. Each demodulated sample, denoted by (b̂[j],b̂[j+N]), j∈[0, N−1], is typically represented as a 2m-bit metric, where the most significant m bits and least significant m bits correspond to the I and Q metric of the demodulated sample, respectively. Feeding the demoduled samples into the frequency de-interleaver 111, block de-interleaver 113, and time de-interleaver 117 gives rise to the de-interleaved data in its original pre-interleaved form. This de-interleaved data (I and Q metric) are then presented to the channel decoder for channel decoding.

De-interleaving process generally needs considerable sizes of storage units. A conventional de-interleaving approach with two stage operations is known to involve a buffer for performing frequency de-interleaving and block de-interleaving in one stage and a memory for performing time de-interleaving in another stage. Note that the OFDM demodulator 109 is typically implemented in a manner of serial-in-serial-out. This implies that after frequency de-interleaving and block de-interleaving, the first output sample from the OFDM demodulator 109 may not correspond to the first sample to be fed to the time de-interleaver 117, and so as for the other samples. Accordingly, a buffer is required for the conventional two-stage approach to temporarily store the entire frequency de-interleaved and block de-interleaved data of an OFDM symbol.

Notice that data are written into the above-mentioned buffer in a non-sequential order due to the frequency de-interleaving and block de-interleaving, but they are typically read out from the buffer in a sequential order for further time de-interleaving. As such, writing data into the buffer may overwrite previously stored data that have not been read out yet. A typical approach to solve this problem is to read data from the buffer in the guard interval of an OFDM symbol while writing data into the buffer in the useful interval of the following OFDM symbol. This approach, however, requires a higher rate of reading data from the buffer as well as a higher rate of performing the following time de-interleaving operations, since the guard interval is generally much less than the useful interval.

The conventional two-stage approach, thus has two main drawbacks: (1) larger circuitry due to the use of frequency and block de-interleaving buffer and (2) higher power consumption due to higher processing rate for de-interleaving the interleaved data.

SUMMARY OF THE INVENTION

The present invention has been made to overcome the above-mentioned drawbacks of conventional de-interleaving process in a COFDM receiver. An object of the present invention is to provide a cost- and power-effective de-interleaving apparatus in a COFDM receiver. Specifically, the apparatus of this invention comprises a de interleaving memory and a controller. The controller generates memory read/write control signals as well as memory access addresses for the frequency de-interleaving, block de-interleaving and time de-interleaving process. The demodulated samples are directly stored into and read out from the de-interleaving memory according to the read/write controls and the access addresses generated by the controller with no need of any additional buffer during the de-interleaving process.

Another object of the invention is to provide a method for de-interleaving the interleaved data in a COFDM receiver. In the method, frequency de-interleaving, block de-interleaving and time de-interleaving are performed in a manner of one-stage approach. Accordingly, the method of this invention comprises the steps of (a) generating the correct access addresses of the de-interleaving memory for the interleaved data; and (b) de-interleaving the interleaved data in a manner of performing frequency de interleaving, block de-interleaving and time de-interleaving with only the de-interleaving memory.

The strategy for generating the access addresses of the de-interleaving memory is to first define the memory size required for de-interleaving an OFDM symbol and then generate pointers including segment pointer, group pointer, sub-group pointer, and cell pointer to allocate the correct access addresses of the memory.

With the de-interleaving memory, each pair of (b[j], b[j+N]), j∈[0, N−1], from the demodulator output can be stored as a basic memory cell. The block de-interleaving can then be effectively performed by reading out either the most or least significant m bits from the de-interleaving memory.

An advantage of the invention is relatively low memory cost. Only the de-interleaving memory is required to perform the de-interleaving process in a COFDM receiver. No additional buffer is needed to proceed the frequency de-interleaving and block de-interleaving for the interleaved data.

It is yet another advantage of the invention to further reduce the cost of the de-interleaving circuitry by directly using the de-interleaving memory combined with the access addresses of the memory. Accordingly, the controller is used to generate the correct access addresses of the memory and controls the read and write operations to the memory.

The foregoing and other objects, features, aspects and advantages of the present invention will become better understood from a careful reading of the detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1A:
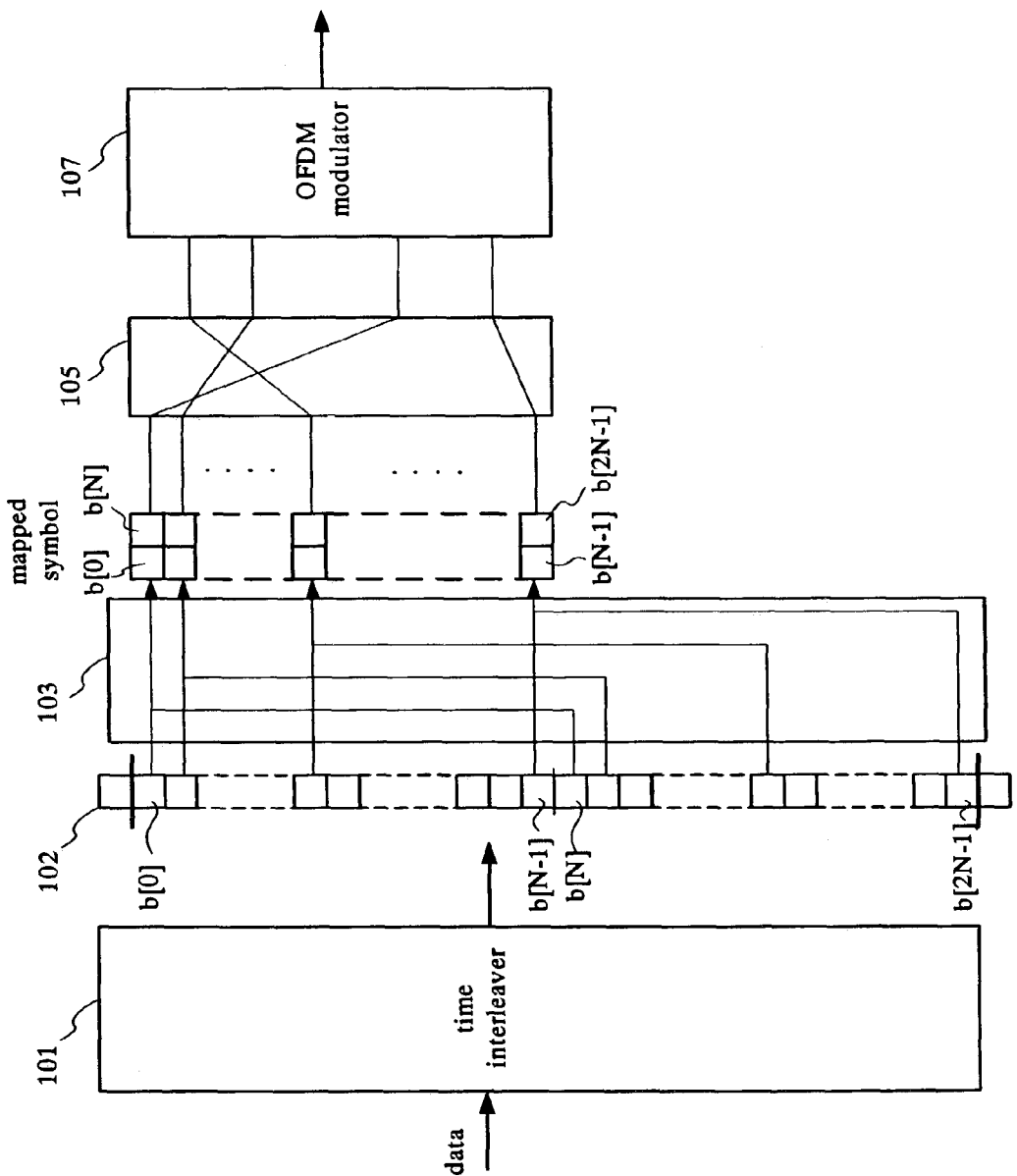
FIG. 1a is a block diagram illustrating the interleaving process in a DAB transmitter.
Figure 1B:
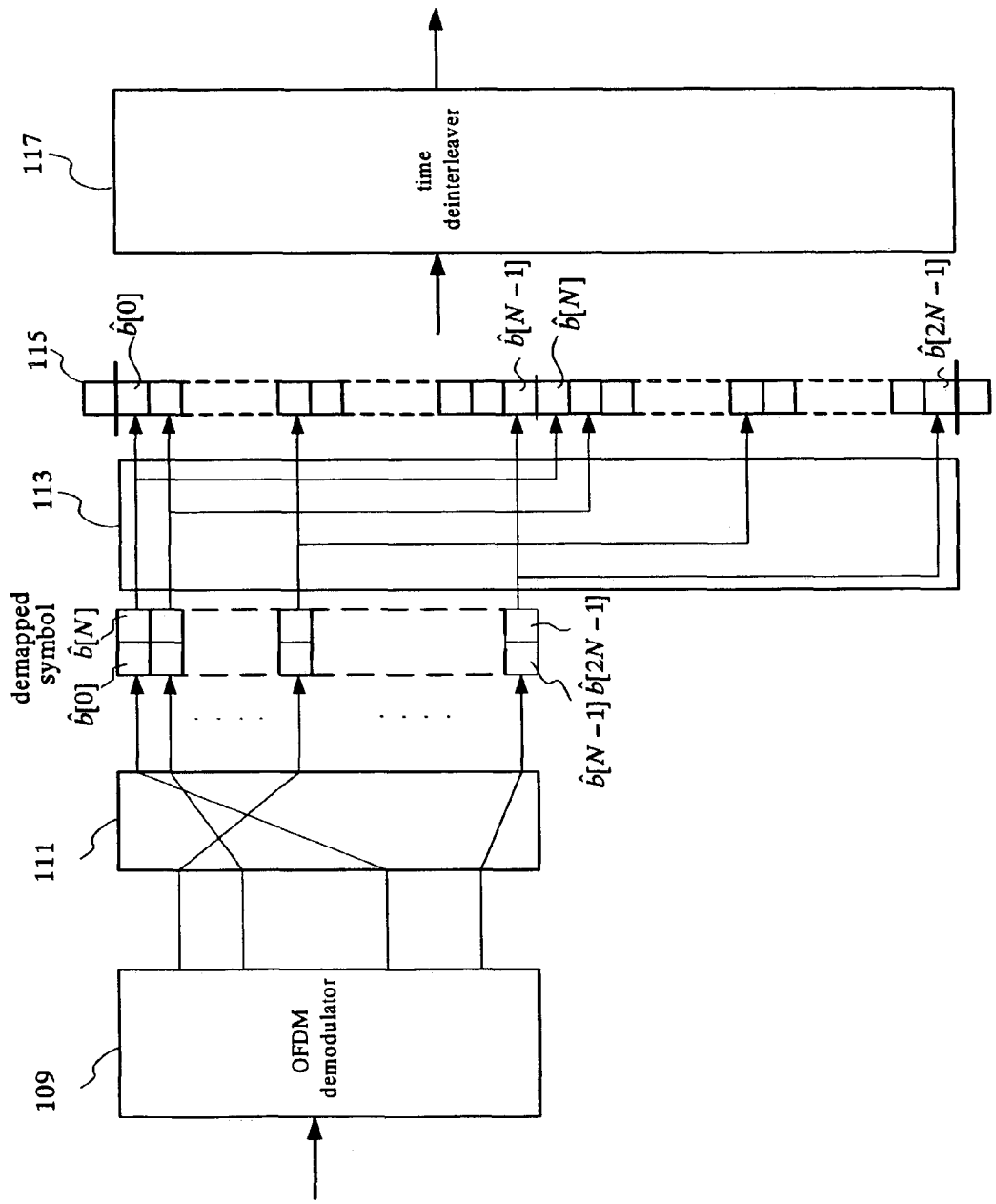
FIG. 1b is a block diagram illustrating the de-interleaving process in a DAB receiver.
Figure 2:
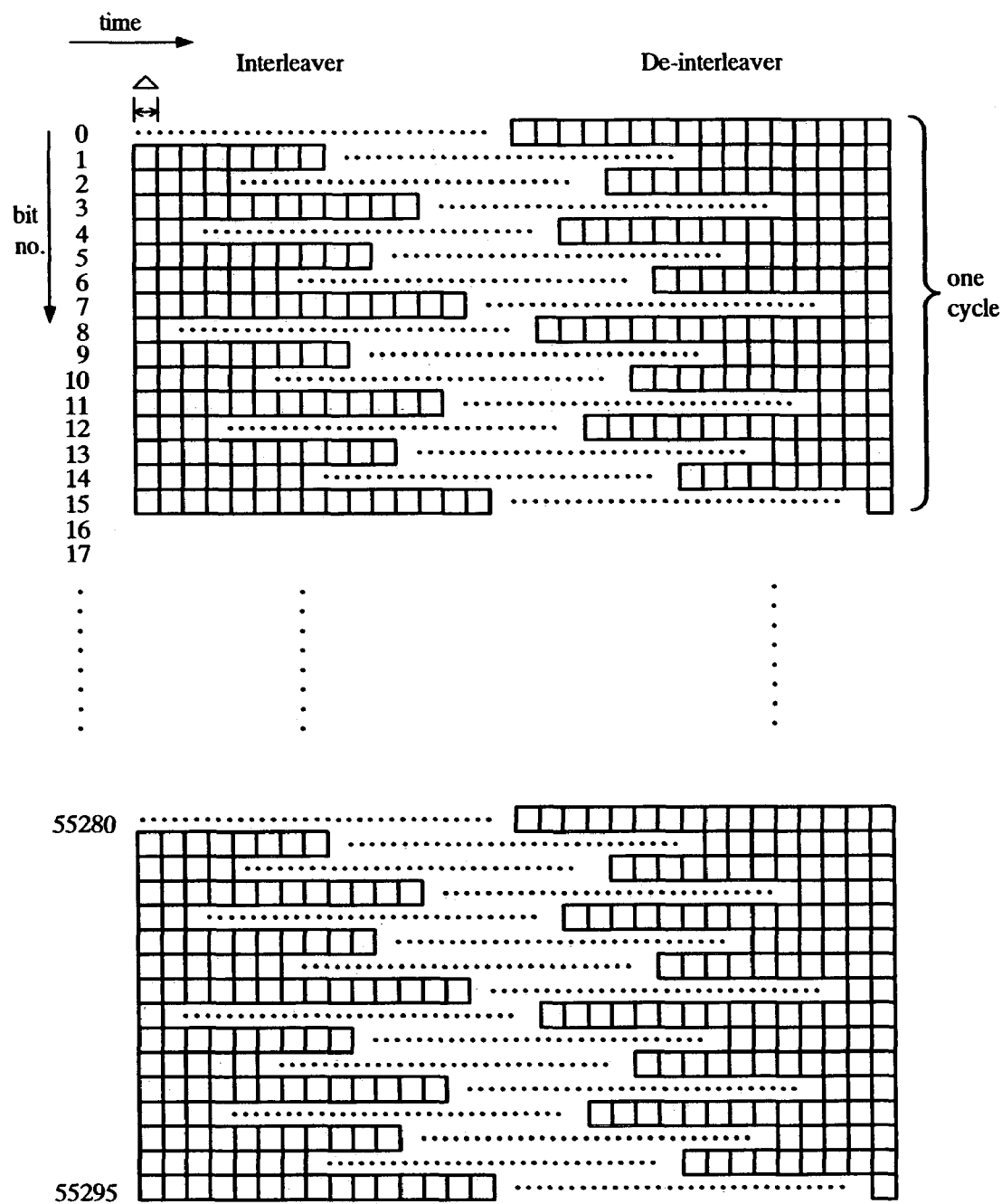
FIG. 2 shows the delay pattern for each bit in a CIF to perform the time interleaving and time de-interleaving.

It is known that the interleaved data stream is transmitted according to an OFDM modulation technique in a DAB system. Each one of the common interleaved frames (CIF) in a DAB system contains 55296 bits. The time interleaving is performed by a unit of 16 bits according to a cyclic repeated delay pattern, and each bit in one cycle corresponds to a certain number of delay units that is required to perform the time interleaving. This is further shown in FIG. 2, where a small blank square represents a delay unit ($\Delta$). In DAB, a delay unit equals to 24 milliseconds, and it is the duration of a CIF too. In a receiver, the time de-interleaver thus needs a complementary number of delay units for each bit in a cycle to perform the time de-interleaving. The left-hand side and right-hand side of FIG. 2 show the number of delay units for each bit in a CIF to perform the time interleaving and time de-interleaving, respectively.

Figure 3:
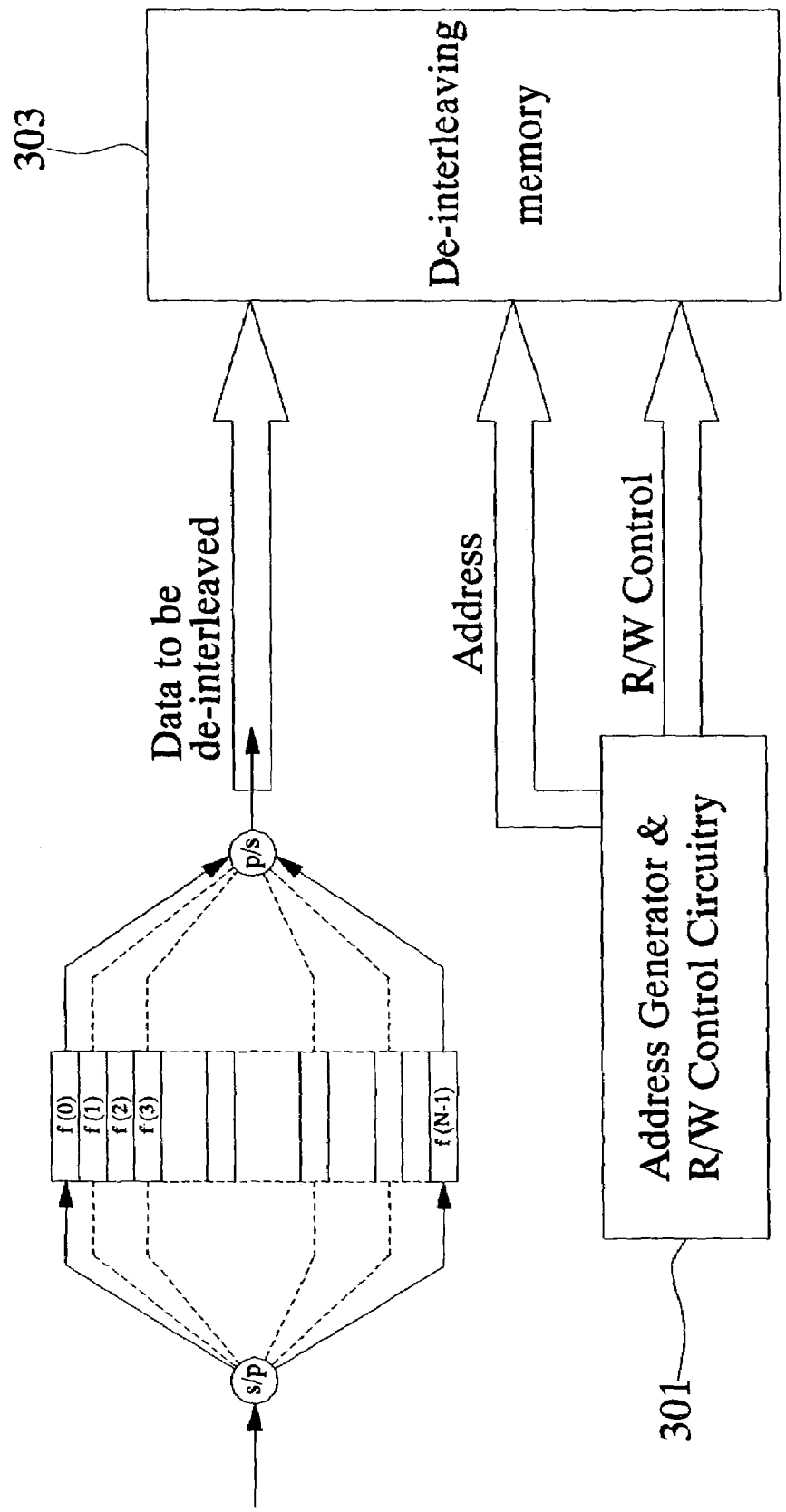
FIG. 3 is a block diagram of an embodiment according to the invention for de-interleaving the interleaved data using a de-interleaving memory in a COFDM receiver.

The gist of the present invention is using a de-interleaving memory combined with memory address computation for de-interleaving the interleaved data in a COFDM receiver. FIG. 3 shows a block diagram of the apparatus for de-interleaving the interleaved data using a de-interleaving memory in a COFDM receiver according to this invention. The apparatus comprises a controller 301, and a de-interleaving memory 303.

Figure 4:
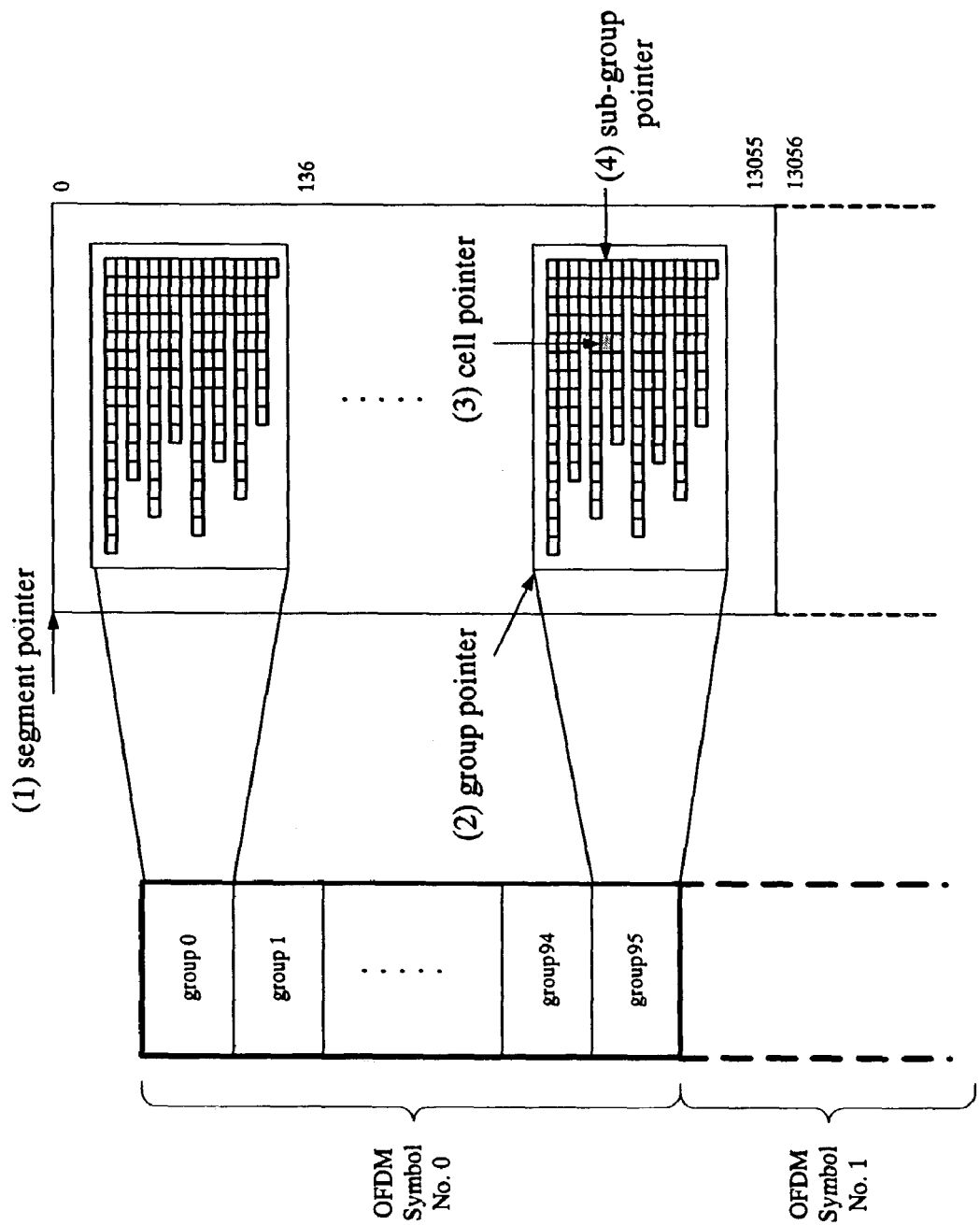
FIG. 4 is a diagram illustrating the four pointers, segment pointer, group pointer, sub-group pointer and cell pointer.

Referring to FIG. 3, when a demodulator provides demodulated samples usually in a manner of serial-in-serial-out, the de-interleaving memory 303 is used for de-interleaving the demodulated samples. The controller 301 generates the correct access addresses of the de-interleaving memory 303 for the data to be de-interleaved, and controls the read and write operations to the de-interleaving memory 303. In order to generate the correct access addresses, the controller 301 further comprises an address generator having a plurality of base address generators, and a read/write control circuitry. These base address generators include a segment base address generator, a group base address generator, a sub-group base address generator, and a cell base address generator. A base address generator includes a pointer that indicates the starting address of a segment, a group or a sub-group in the de-interleaving memory 303, or the offset address of a cell in a sub-group. FIG. 4 is a diagram illustrating the four pointers. How to create these pointers and calculate the correct read/write address of the de-interleaving memory 303 will be discussed further in the description.

First, a segment is defined as the required memory capacity in the de-interleaving memory 303 for de-interleaving an OFDM symbol, and the segment size needs to be determined in the design of this invention. Mode I in Table 1 is used to illustrate on how to determine the segment size. As mentioned before, a CIF in a DAB system contains 55296 bits. For mode I, each OFDM symbol can transmit 3072 bits. In other words, each CIF includes 18 (=55296/3072) OFDM symbols. Each OFDM symbol can be further divided into 96 (=3072/16/2) groups, i.e., 96 cycles of repeated delay pattern.

Referring back to FIG. 2, the total delay units for each bit to perform the time interleaving and de-interleaving equal 16, i.e. the sum of the delay units in both sides for each row equals 16. In the receiver, a group size is determined by the total delay units in a cycle to perform the time de-interleaving. Therefore, the group size to perform the time de-interleaving in the receiver for mode I can be calculated as 16+8+12+4+14+6+10+2+15+6+11+3+5+9+1, that is the sum of the integers from 1 to 16, and equal to 136. Accordingly, a segment in mode I has 13,056 (=136*96) memory cells. Table 1 shows the correspondence between the segment size and the number of total OFDM symbols in a CIF for four different modes, mode I~mode IV.

Next, a sub-group and a cell are defined, and each corresponding pointer needs to be determined so that the correct write address of the de-interleaving memory 303 can be calculated for the demodulated samples. In the invention, a sub-group is defined as a row in a group and a cell is defined as a memory cell in a row. Accordingly, the segment pointer points to the starting address of the current segment, the group pointer points to the starting address of the current group after the segment pointer has been determined, the sub-group pointer points to the current row after the group pointer has been determined, and the cell pointer points to the current cell after the sub-group pointer has been determined.

Consequently, the memory location for writing data after demodulation into the de-interleaving memory 303 is calculated as $$\text{Write\_address} = \text{segment\_pointer\_}wr + \text{group\_pointer\_}wr + \text{sub-group\_pointer\_}wr + \text{cell\_pointer\_}wr. \quad (1)$$

In the following, how to calculate each pointer is further described.

For a DAB receiver, the segment size is given in Table 1. The segment pointer for writing data into the de-interleaving memory 303 is calculated as $$\text{segment\_pointer\_}wr = \text{ofdm\_symbol\_no} * \text{segment\_size}, \quad (2)$$

where ofdm_symbol_no denotes the OFDM symbol number currently being proceeded.

To calculate the group_pointer_wr, an index deitlvfreq_no is defined as a frequency index after frequency de-interleaving. It can be obtained via referring to a look up table (LUT) performed an index re-numbering operation on the output sub-carrier index of the demodulator. As known before, the time de-interleaving is performed by a unit of 16 bits according to a cyclic repeated delay pattern in a CIF. Then, group_pointer_wr can be calculated as $$\text{group\_pointer\_}wr = Q(\text{deitlvfreq\_no}/16) * \text{group\_size}, \quad (3)$$

where $Q(x/y)$ denotes the quotient of x/y, and group_size denotes the required memory capacity in a group. For mode I, group_size equals 136.

After having the group pointer, the starting address for the current group is known. The sub-group pointer will be calculated to point to the row in the current group the data should be written into. This can be computed by taking the remainder of deitlvfreq_no/16. For calculating address for the current row in the group, the offset from the starting address of the current row to the starting address of the current group can also be found out by referring to a relatively small look up table (LUT) shown in Table 2, where Bit # relates to a row number in a group. For example, if the value of deitlvfreq_no(mod 16) is 3, then Bit # is 3. This means that it corresponds to the 4th row in a group, and the offset from the 4th row to the starting address of the group is 36. If Bit # is 15, then it relates to the 16th row and the offset 135. Therefore, sub-group_pointer_wr can be described as $$\text{sub-group\_pointe\_}wr = LUT(\text{deitlvfreq\_no}(\text{mod } 16)). \quad (4)$$

After the pointers of segment, group and sub-group have been calculated, the correct write address can be determined by further computing the cell pointer. Because each sub-group requires a cell pointer to indicate which cell the data should be written into, 16 cell pointers are required for 16 sub-groups. Each cell pointer is in the range from 0 to the number of delay units of its corresponding sub-group. For example, the number of delay units for sub-group 2 is 12, i.e. there are 12 cells in sub-group 2. Then cell pointer is in the range from 0 to 11 in a cyclic repeated pattern. It should be noted that each of the number of delay units for its corresponding sub-group is different for time de-interleaving; besides, each cell pointer automatically increases by one for every CIF duration, and goes on cyclic counting.

Finally, the write address is determined by summing up the four pointers, segment_pointer_wr, group_pointer_wr, sub-group_pointer_wr and cell_pointer_wr. The write address can be rewritten in a more specific way as follows.

$$\text{Write\_address} = \text{ofdm\_symbol\_no} * \text{segment\_size} + Q(\text{deitlvfreq\_no}/16) * \text{group\_size} + LUT(\text{deitlvfreq\_no}(\text{mod } 16)) + \text{cell\_pointer\_}wr \quad (5)$$

After having been delayed the time period of 16 CIFs, data can be read from the de-interleaving memory 303. When data is to be read from the de-interleaving memory 303, the four pointers, segment_pointer_rd, group_pointer_rd, sub-group_pointer_rd and cell_pointer_rd, are used to determine the read address of the data. While, it should be noted that the data to be written cannot overwrite the previous data which have not been read from the memory yet. Accordingly, during the time period of the data in the $n^{th}$ segment being written into the memory, the data in the $(n+1)^{th}$ segment is being read from the memory.

More specifically, the index deitlvfreq_no for calculating the group pointer and sub-group pointer can be replaced by a read counter, read_counter, which counts from 0 to N−1 and restarts from 0, where N is the number of used sub-carriers. For mode I, the read counter counts from 0 to 1535 for computing the memory read addresses. In order to prevent the stored data from being overwritten by new data, the value of cell_pointer_rd is the same as that of cell_pointer_wr and the read counter has two cyclic countings for an OFDM symbol. In other words, there are two rounds of reading during a period of an OFDM symbol. During the first round, the I metric (most significant m bits) in the location pointed by the read address are read from the memory. During the second round, the Q metric (least significant m bits) in the location pointed by the read address are read from the memory. This completes the de-interleaving process of frequency de-interleaving, block de-interleaving, and time de-interleaving. Therefore, the read address can be calculated as $$\text{Read\_address} = (\text{ofdm\_symbol\_no}+1) * \text{segment\_size} + Q(\text{read\_counter}/16) * \text{group\_size} + LUT(\text{read\_counter}(\text{mod } 16)) + \text{cell\_pointer\_}rd. \quad (6)$$

Compared with the output data rate of the demodulator, this invention is only at the same rate for writing data into memory and is at the double rate for reading data from memory. Therefore, an advantage of the invention is relatively low power consumption, whereas the conventional two-stage approach requires higher processing rate for performing de-interleaving operations.

Recall that each demodulated data is a 2m-bit metric in which the most significant m bits and least significant m bits represent I metric and Q metric, respectively. If the demodulated data in one OFDM symbol are stored in the de-interleaver, then this de-interleaving memory requires 884736m(=55296*16*m) bits to store the data of 16 CIFs. In the design of the present invention, only the space of useful data of 16 CIFs is required for the de-interleaving memory 303 and this amounts to only 470016m (=13056*18*2m) bits for mode I. Therefore, another advantage of the invention is relatively low memory cost.

Figure 5:
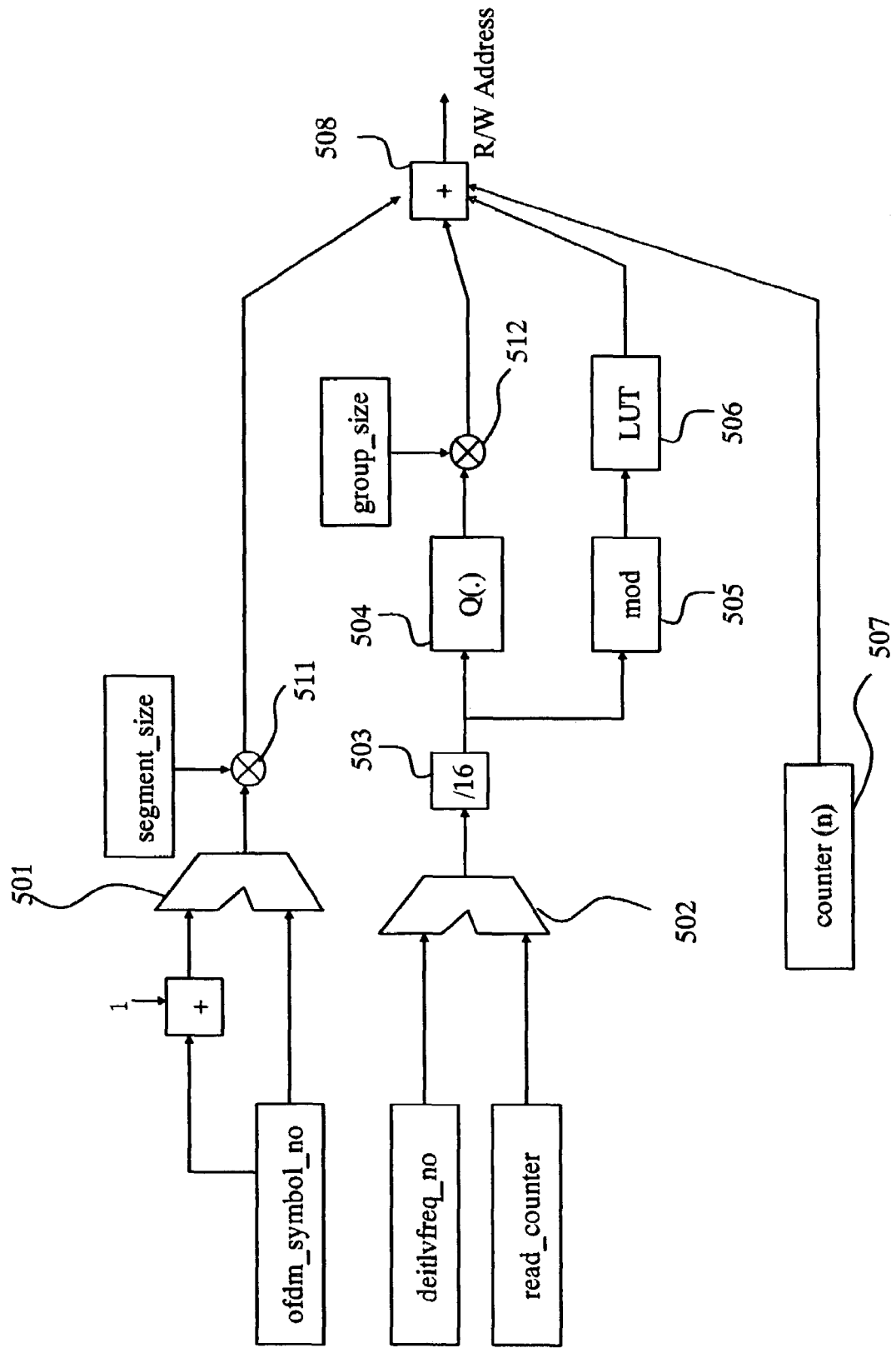
FIG. 5 shows an example of the memory read/write address generator for the controller in the embodiment of FIG. 3.

FIG. 5 is a block diagram illustrating memory read/write address generator for the controller 301 in the embodiment of FIG. 3 according to the invention. Two multiplexers 501 and 502 determine whether read or write address is to be generated. When read address is to be generated, the multiplexer 501 selects ofdm_symbol_no+1 as its output, and the multiplexer 502 selects read_counter as its output. When write address is to be generated, the multiplexer 501 selects ofdm_symbol_no as its output, and the multiplexer 502 selects deitlvfreq_no as its output.

Referring back to the equations for Write_address and Read_address, it can be seen that the computation for either Write_address or Read_address needs two multiplications, a division of performing quotient and modulus operations, a look up table, and a cyclic counting as well as a summation which sums up the resultant values from the two multiplications, the look up table, and the counting. In other words, the address generator in the embodiment of FIG. 5 may include two multipliers 511 and 512, a divider 503, a quotient unit 504, a remainder unit 505, a look up table 506, a counter 507, and an adder 508. Note that in DAB system, the divider with divisor 16 can be easily implemented using shift registers since the divisor 16 is an integer power of two. Therefore, implementation of the address generator is relatively simple.

It is also notable that there is no additional buffering between the demodulator and the de-interleaving memory 303 according to the present invention. By using the de-interleaving memory 303 combined with memory address computation for the interleaved data, frequency de-interleaving, block de-interleaving, and time de-interleaving are performed in one-stage approach in the COFDM receiver. All digital I, Q components of the plurality of phase-modulated sub-carriers in the received DAB signal can be saved in the same memory, i.e. the de-interleaving memory 303 of the invention.

Although the present invention has been described with reference to the preferred embodiments, it should be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

TABLE 1

| mode | segment size | # of total OFDM symbols |
|---|---|---|
| mode I | 13,056 | 18 |
| mode II | 3,264 | 72 |
| mode III | 1,632 | 144 |
| mode IV | 6,528 | 36 |

TABLE 2

| Bit # | Offset |
|---|---|
| 0 | 0 |
| 1 | 16 |
| 2 | 24 |

TABLE 2-continued

| Bit # | Offset |
|---|---|
| 3 | 36 |
| 4 | 40 |
| 5 | 54 |
| 6 | 60 |
| 7 | 70 |
| 8 | 72 |
| 9 | 87 |
| 10 | 94 |
| 11 | 105 |
| 12 | 108 |
| 13 | 121 |
| 14 | 126 |
| 15 | 135 |

What is claimed is:

1. An apparatus for de-interleaving interleaved data in a coded orthogonal frequency division multiplexing receiver, comprising:

a de-interleaving memory for de-interleaving said interleaved data; and a controller for generating correct access addresses of said de-interleaving memory for the data to be de-interleaved, and controlling read and write operations to said de-interleaving memory;

wherein said controller further comprises an address generator having a plurality of base address generators and a read/write control circuitry.

2. The apparatus for de-interleaving the interleaved data in a coded orthogonal frequency division multiplexing receiver as claimed in claim 1, wherein said base address generators further include a segment base address generator, a group base address generator, a sub-group base address generator, and a cell base address generator.

3. The apparatus for de-interleaving the interleaved data in a coded orthogonal frequency division multiplexing receiver as claimed in claim 2, wherein each said base address generator of said plurality of base address generators includes a pointer that indicates the starting address of a corresponding segment, group, or sub-group, or the address of a corresponding cell.

4. The apparatus for de-interleaving the interleaved data in a coded orthogonal frequency division multiplexing receiver as claimed in claim 1, wherein said address generator is implemented by two multiplexers, two multipliers, a divider, a quotient unit, a remainder unit, a look up table, a counter, and two adders.

5. A method for de-interleaving interleaved data in a coded orthogonal frequency division multiplexing receiver, said de-interleaving including frequency de-interleaving, block de-interleaving and time de-interleaving, said method comprising the steps of:

(a) generating access addresses of a de-interleaving memory and controlling read and write operations for said interleaved data; and (b) de-interleaving said interleaved data in a manner of simultaneously performing said frequency de-interleaving, said block de-interleaving and said time de-interleaving in said de-interleaving memory.

6. The method for de-interleaving the interleaved data in a coded orthogonal frequency division multiplexing receiver as claimed in claim 5, wherein said generating access addresses in said step (a) further comprises the steps of:

(a1) generating a plurality of base addresses including a segment base address, a group base address, a sub-group base address and a cell address; and (a2) calculating said access address according to said plurality of base addresses.

7. The method for de-interleaving the interleaved data in a coded orthogonal frequency division multiplexing receiver as claimed in claim 6, wherein said segment base address in said step (a1) is a pointer that indicates the starting address of a segment, and a segment is defined as a required memory space in said de-interleaving memory for de-interleaving an orthogonal frequency division multiplexing symbol.

8. The method for de-interleaving the interleaved data in a coded orthogonal frequency division multiplexing receiver as claimed in claim 6, wherein said group base address in said step (a1) is a pointer that indicates the starting address of a group in a current segment, and a group is determined by total delay units in a cycle to perform said time de-interleaving for said interleaved data.

9. The method for de-interleaving the interleaved data in a coded orthogonal frequency division multiplexing receiver as claimed in claim 6, wherein said sub-group base address in said step (a1) is a pointer that indicates the starting address of a sub-group, and a sub-group is defined as a row in said group.

10. The method for de-interleaving the interleaved data in a coded orthogonal frequency division multiplexing receiver as claimed in claim 9, wherein said sub-group base address is determined by referring to a look up table that points out the offset from the starting address of said row to the starting address of said group.

11. The method for de-interleaving the interleaved data in a coded orthogonal frequency division multiplexing receiver as claimed in claim 6, wherein said cell address in said step (a1) is a pointer that indicates which cell in said sub-group that the interleaved data is to be written into or read from.

12. A method for generating an access address of a de-interleaving memory used for a de-interleaving process in a coded orthogonal frequency division multiplexing receiver, comprising the steps of:

(a) generating a segment pointer that indicates the starting address of a segment in said de-interleaving memory, wherein a segment is defined as a required memory space for de-interleaving an orthogonal frequency division multiplexing symbol;

(b) dividing said segment into a plurality of groups, and generating a group pointer that indicates the starting address of a group in said segment, wherein a group is determined by total delay units in a cycle to perform said time de-interleaving for said interleaved data;

(c) generating a sub-group pointer by referring to a look up table, wherein a sub-group is defined as a row in said group and said sub-group pointer indicates the starting address of said sub-group;

(d) generating a cell pointer that indicates which cell in said sub-group the interleaved data is to be written into or read from, wherein said cell pointer has an initial value and said initial value is pre-determined; and (e) calculating said access address by summing up said segment pointer, said group pointer, said sub-group pointer and said cell pointer.

13. The method for generating an access address of a de-interleaving memory used for a de-interleaving process in a coded orthogonal frequency division multiplexing receiver as claimed in claim 12, wherein said look up table points out the offset from the starting address of said row to the starting address of said group.

* * * * *